(12) United States Patent
Huber

(10) Patent No.: US 10,122,372 B1
(45) Date of Patent: Nov. 6, 2018

(54) CIRCUIT INCLUDING CALIBRATION FOR OFFSET VOLTAGE COMPENSATION

(71) Applicant: Keysight Technologies, Inc., Minneapolis, MN (US)

(72) Inventor: Daniel James Huber, Santa Clara, CA (US)

(73) Assignee: Keysight Technologies, Inc., Santa Rosa, CA (US)

(*) Notice: Subject to any disclaimer, the term of this patent is extended or adjusted under 35 U.S.C. 154(b) by 0 days.

(21) Appl. No.: 15/853,143

(22) Filed: Dec. 22, 2017

(51) Int. Cl.
  *H03M 1/06* (2006.01)
  *H03M 1/10* (2006.01)

(52) U.S. Cl.
  CPC ........ *H03M 1/0607* (2013.01); *H03M 1/109* (2013.01); *H03M 1/1023* (2013.01)

(58) Field of Classification Search
  CPC ... H03M 1/0607; H03M 1/1023; H03M 1/109
  USPC ......................................... 341/118, 136, 144
  See application file for complete search history.

(56) References Cited

U.S. PATENT DOCUMENTS

| | | | | |
|---|---|---|---|---|
| 6,344,816 B1* | 2/2002 | Dedic | ................. | H03M 1/0678 341/144 |
| 6,392,573 B1* | 5/2002 | Volk | ................. | H03K 17/04106 341/118 |
| 6,768,438 B1* | 7/2004 | Schofield | ............. | H03M 1/068 327/408 |
| 7,034,733 B2* | 4/2006 | Dedic | ................. | H03M 1/0881 341/144 |
| 7,098,830 B2* | 8/2006 | Lin | ..................... | H03M 1/0614 341/118 |
| 7,449,921 B2* | 11/2008 | Jeung | ................. | H03K 17/165 327/34 |
| 8,830,101 B1* | 9/2014 | Opris | ................. | H03M 1/0614 341/144 |
| 8,890,730 B2 | 11/2014 | Lowney et al. | | |
| 8,928,513 B1* | 1/2015 | Waltari | .............. | H03M 1/0614 341/144 |
| 9,379,728 B1 | 6/2016 | Singh et al. | | |
| 9,716,509 B2 | 7/2017 | Zhao | | |

(Continued)

OTHER PUBLICATIONS

Ken Poulton et al., "A 7.2-GSa/s, 14-bit or 12-GSa/s, 12-bit DAC in a 165-GHz fT BiCMOS Process", 2011 Symposium on VLSI Circuits Digest of Technical Papers, pp. 62-63, Jun. 2011.

(Continued)

*Primary Examiner* — Khai M Nguyen

(57) ABSTRACT

A switching digital-to-analog converter (DAC) includes a logic gate for receiving a digital input signal having rising and falling edges defining an input pulse width, and outputting an offset input signal having rising and falling edges defining a mismatched pulse width different from the input pulse width due to relative movement of the rising and falling edges in response to a voltage offset introduced by the logic gate. A DC voltage source provides a direct current (DC) calibration signal, and a summer adds the DC calibration signal and the offset input signal to compensate for the voltage offset introduced by the logic gate, and to provide a corrected input signal. A unit DAC receives the corrected input signal, and selectively switches current to an output of the switching DAC in response to voltage values of the corrected input signal to provide an analog output.

20 Claims, 5 Drawing Sheets

(56) References Cited

U.S. PATENT DOCUMENTS 9,762,256 B2    9/2017   Chandra et al.
9,825,643 B1   11/2017   Taylor et al.

OTHER PUBLICATIONS

Bob Jewett et al., "A 1.2GS/s 15b DAC for precision signal generation", ISSCC. 2005 IEEE International Digest of Technical Papers. Solid-State Circuits Conference, 2005, pp. 110-111 and p. 587 vol. 1, Feb. 2005.
Lucas Duncan et al., "A 10b DC-to-20GHz multiple-return-to-zero DAC with >48dB SFDR", IEEE International Solid-State Circuits Conference (ISSCC), Feb. 7, 2017, pp. 286-287.
Lucas Duncan et al., "A 10-bit DC-20-GHz Multiple-Return-To-Zero DAC with >48dB SFDR", IEEE Journal of Solid-State Circuits Conference (ISSCC), vol. 52, No. 12, Dec. 2017, pp. 3262-3275.

* cited by examiner

CIRCUIT INCLUDING CALIBRATION FOR OFFSET VOLTAGE COMPENSATION

BACKGROUND

Unwanted offset voltage may be introduced into electronic devices during operation, for which compensation is desired to assure proper functionality of the electronic devices and/or the systems incorporating such devices. For example, a high speed digital-to-analog converter (DAC) may include multiple unit switching elements (unit DACs) to respectively provide analog conversion of portions of data (bits) in input parallel data streams. Timing skew in the unit switching elements of the high speed DAC may degrade the spurious or noise floor performance. Attempts to keep the timing skew low enough for reliable operation include employment of a number of conventional techniques.

For example, an electrical device or system may be carefully laid out to avoid systematic mismatch between the parallel paths. This is usually not sufficient on its own because of random mismatch. Using large devices and minimizing signal delay in the parallel paths typically reduce random mismatch, which may be quite effective. However, reducing mismatch in this manner results in higher power dissipation, and may also reduce analog bandwidth if the device is too large. Dynamic element matching (DEM) techniques may spread high-order spurs caused by timing skews into noise, improving spurious-free dynamic range (SFDR) at the cost of degrading the noise floor. However, improvement in regard to low-order spurs (e.g., second and third order spurs) is typically limited. Also, if the noise floor degradation is unacceptable, then the timing skews must be corrected, as opposed to simply randomized into noise.

Another example involves resampling data currents with a single low-skew clock. This may be effective at lower sample rates where data transitions are fully blocked by the resampler. However, at very high sample rates, resampler operation becomes sloppy and some of the data transition errors leak through. Also, another conventional technique involves inserting a programmable delay into the clock path of each parallel path in the switching DAC to enable calibration. Although this technique has potential for good performance, adding a programmable delay into each parallel data slice with adequate range and precision significantly complicates the layout. Depending on how the programmable delay is implemented, it may increase uncalibrated mismatch, degrading uncalibrated performance. The calibration procedure typically requires a spectrum analyzer, so in-system recalibration is expensive and time consuming.

Thus, what is needed is a simple and reliable system and technique that compensates for offset voltage.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements throughout the drawings and written description.

DETAILED DESCRIPTION

Figure 1A:
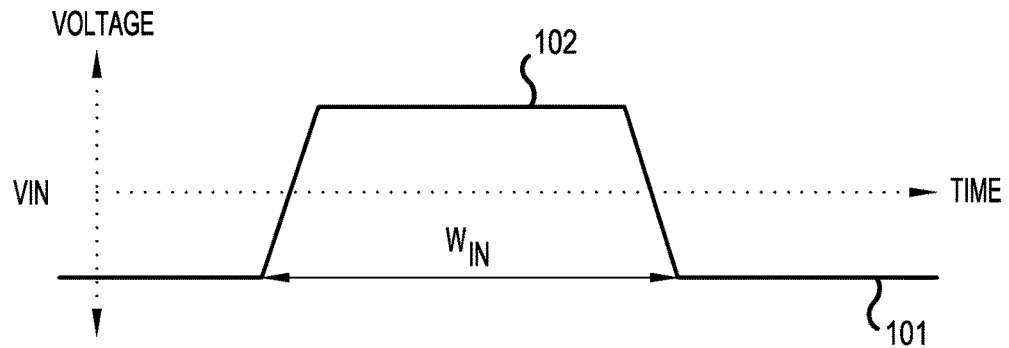
FIG. 1A is a graphs depicting a digital input signal having an input pulse.

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree to one of ordinary skill in the art. The term "approximately" means to within an acceptable limit or amount to one of ordinary skill in the art. Relative terms, such as "above," "below," "top," "bottom," "upper" and "lower" may be used to describe the various elements" relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

According to various embodiments, a switch driver offset calibration device and method reduce timing skew in unit switching elements (e.g., unit DACs) of a high speed switching DAC, for example. This enables design and implementation of a higher performance switching DAC, or a switching DAC that achieves equivalent performance of a conventional DAC but at lower power dissipation and/or lower calibration complexity. In addition to reducing effects of high-order spurs and improving noise floor, the various embodiments also reduces effect of second order distortion. In addition, implementation of the various embodiments requires only DC measurements at the output of the high speed switching DAC, enabling inexpensive in-system recalibration.

Generally, digital input signals (e.g., digital data signals) of a high speed switching DAC, for example, include one or more input pulses, each of which has corresponding rising and falling edges that define the input pulse width. Random variations in logic gates that operate on digital input signals driving unit DAC switches of the high speed switching DAC cause timing errors with large negative correlation on the rising and falling edges of the input pulses of the digital input signals. That is, when the rising edge of an input pulse is delayed from its ideal position by X ps, for example, the falling edge of the input pulse is advanced from its ideal position by nearly X ps, which may be referred to as "offset" or "mismatch" In the corresponding output pulse. Only a small fraction of the total mismatch of an input pulse is common to both the rising and falling edges.

For example, assume the time delay from rising edge of the input pulse to the rising edge of the output pulse is indicated by TR, and the time delay from the falling edge of the input pulse to falling edge of the output pulse is TF. Ideally, TR=TF=T0 for all switching paths of a high speed switching DAC, where T0 is the mean of TR and TR across all switching paths. However, because of random mismatch, the switching paths have different delays. For a given switching path, 0.5*(TR+TF)−T0 is the mismatch common to both edges, and TR−TF is the rise/fall mismatch. According to various embodiments of this disclosure, each path is calibrated so that TR=TF, i.e., zero rise/fall mismatch. Although the various embodiments may not make TR and TF equal to T0, they do make TR and TF closer to T0 for the switching paths, thus significantly reducing spread and maximum error in TR and TF of the switching paths.

Generally, the TR−TF component is large compared to the 0.5*(TR+TF)−T0 component, which is a function of using differential logic. Mismatch in a differential pair device (which receives a differential pair input signal) manifests primarily as an input referred offset voltage, and does not strongly affect the speed of a logic gate (e.g., a flip-flop) that receives the differential pair input signal. When the logic gate acts like a limiting amplifier, the offset voltage will move the rising and falling edges of the input signal by equal amounts in opposite directions, providing a digital output signal (mismatched output signal or offset output signal) with a mismatched pulse width, which is either shorter or longer than the input pulse width.

Figure 1B:
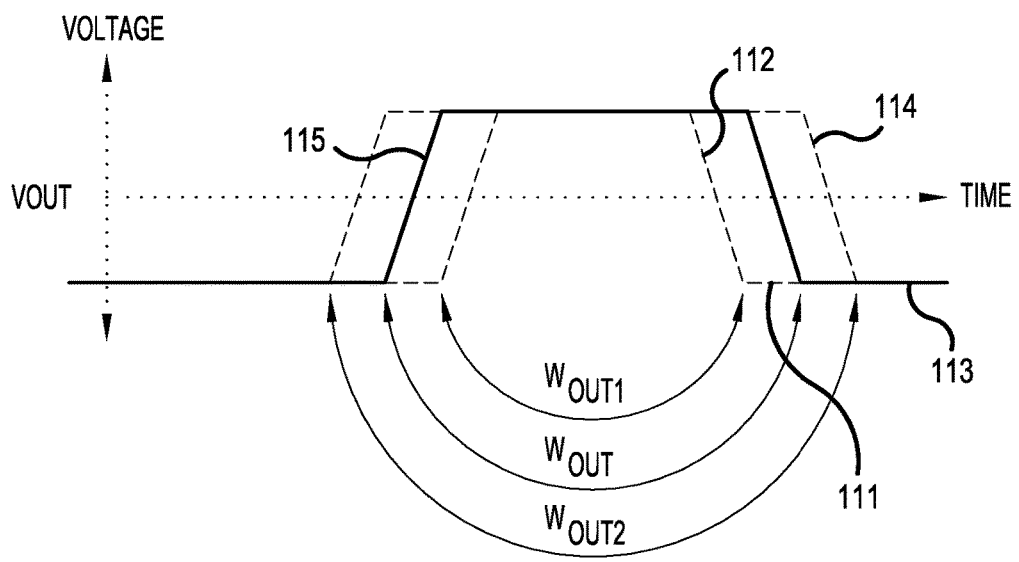
FIG. 1B is a graph depicting a digital output signal having various potential output pulses, affected by offset voltage on the digital input signal.

FIGS. 1A and 1B are graphs depicting the effect of offset voltage on a digital input signal. Referring to FIG. 1A, digital input signal 101 includes a representative input pulse 102 with an input pulse width $w_{in}$. FIG. 1B shows two possible digital mismatched output signals 111 and 113, depending on whether the input signal 101 is affected by a negative voltage offset or a positive voltage offset. In particular, a negative voltage offset applied to the input signal 101 moves the rising and falling edges closer together, resulting in the mismatched output signal 111. The mismatched output signal 111 includes a representative mismatched pulse 112 with a mismatched pulse width $w_{out1}$ that is shorter than the input pulse width $w_{in}$. In contrast, a positive voltage offset applied to the input signal 101 moves the rising and falling edges further apart, resulting in the mismatched output signal 113. The mismatched output signal 113 includes a representative mismatched pulse 114 with a mismatched pulse width $w_{out2}$ that is longer than the input pulse width $w_{in}$.

According to various embodiments, application of a direct current (DC) calibration signal, e.g., provided by a DC voltage source, shifts one or both of the rising and falling edges of the mismatched pulses 112, 114 to provide a calibrated or corrected pulse 115 with a corresponding corrected pulse width $w_{out}$, which matches the input pulse width $w_{in}$ of the input pulse 102. Generally, when the mismatched pulse width is shorter than the input pulse width (as in the case of the mismatched pulse width $w_{out1}$), the DC voltage source provides a DC calibration signal having a positive voltage, and when the mismatched pulse width is longer than the input pulse width (as in the case of the mismatched pulse width $w_{out2}$), the DC voltage source provides a DC calibration signal having a negative voltage, in order to compensate for the relative movement of the rising and falling edges, respectively.

Figure 2:
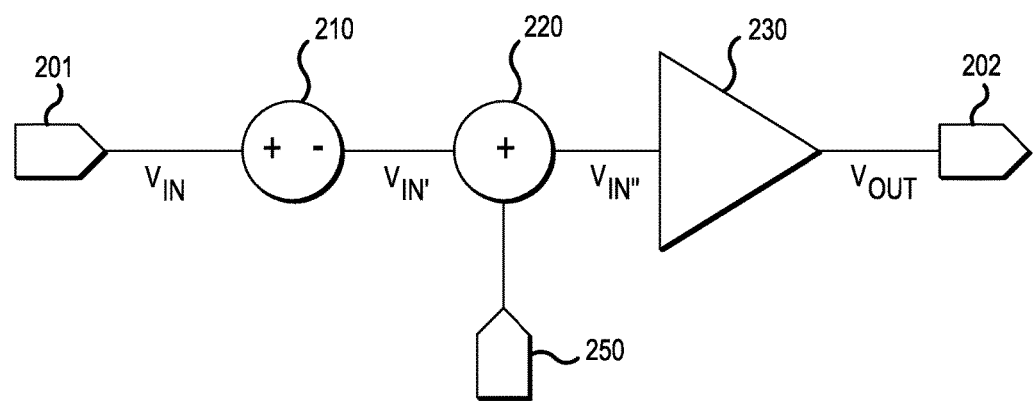
FIG. 2 is a simplified block diagram showing an electronic circuit including offset calibration for offset voltage compensation, according to a representative embodiment.

FIG. 2 is a simplified block diagram showing an electronic circuit including offset calibration for offset voltage compensation, according to a representative embodiment.

Referring to FIG. 2, an electronic circuit 200 includes an input port 201 for receiving digital input signal $V_{IN}$, a limiting buffer 230 and an output port 202 for outputting digital output signal $V_{OUT}$. The electronic circuit 200 further includes an offset voltage source 210 that causes a voltage offset, resulting in offset (or mismatched) input signal $V_{IN}'$. The offset voltage source 210 is representative of any component(s) that injects a voltage offset into the input signal $V_{IN}$, such as a logic device (e.g., logic gates 411-414 discussed below with reference to FIG. 4). The electronic circuit 200 also includes a DC voltage source 250 for injecting an offset calibration signal, and a summer 220 for summing the offset calibration signal and the offset input signal $V_{IN}'$ in order to compensate for the effects of the offset voltage source 210, thereby calibrating the electronic circuit 200. As a result of the compensation, output pulses of the output signal $V_{OUT}$ have the same pulse widths as corresponding input pulses of the input signal $V_{IN}$, as discussed above.

Stated differently, the digital input signal $V_{IN}$ has at least one input pulse, where each input pulse is defined by a rising edge and a corresponding falling edge following a first delay from the rising edge. The offset voltage source 210 injects a voltage, resulting in the offset input signal $V_{IN}'$ having at least one mismatched input pulse, corresponding to the at least one input pulse of the input signal $V_{IN}$, defined by a rising edge and a corresponding falling edge following a second delay, where the second delay is different than the first delay as a result of the injected voltage offset. The summer 220 sums the offset calibration signal and the offset input signal $V_{IN}'$ in order to compensate for the effects of the offset voltage source 210. That is, the summer 220 provides a corrected input signal $V_{IN}''$ having a corrected pulse defined by a rising edge and a corresponding falling edge following a third delay, where the third delay is substantially equal to the first delay.

Figure 3:
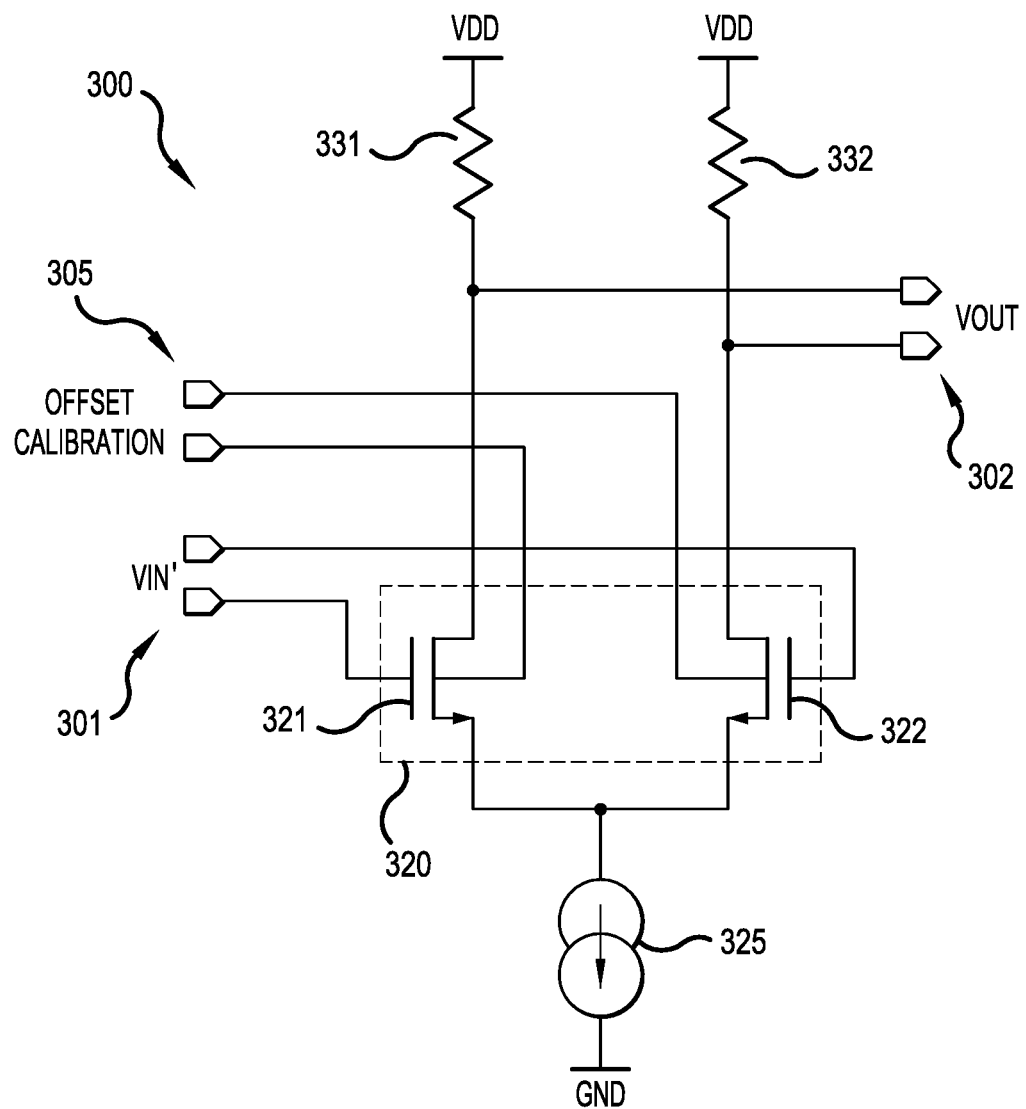
FIG. 3 is a simplified circuit diagram showing an electronic circuit including offset calibration for offset voltage compensation, according to a representative embodiment.

FIG. 3 is a simplified circuit diagram showing an electronic circuit including offset calibration for offset voltage compensation, according to a representative embodiment. As compared to the block diagram in FIG. 2, the circuit diagram in FIG. 3 essentially shows the summer integrated with the limited buffer.

Referring to FIG. 3, an electronic circuit 300 includes an input port 301 for receiving a differential offset input signal $V_{IN}'$ (which is a digital input signal $V_{IN}$ after voltage offset), an output port 302 for outputting differential output signal $V_{OUT}$, and a calibration port 305 for receiving differential calibration signal $V_{CAL}$ from a DC voltage source (not shown).

As mentioned above, the electronic circuit 300 combines the functionality of a limiting buffer and a summer. In this context, the electronic circuit 300 includes a transistor pair 320, including first transistor 321 and second transistor 322, configured to receive the differential offset input signal $V_{IN}'$ and the differential calibration signal $V_{CAL}$. For purposes of explanation, the first and second transistors 321 and 322 are depicted as field effect transistors (FETs), which may include for example gallium arsenide FETs (GaAs FETs), metal-oxide semiconductor FETs (MOSFETs) or heterostructure FETs (HFETs). However, it is understood that any other types of transistors, such as bipolar junction transistors (BJTs), GaAs heterojunction bipolar transistors (HBTs), high electron mobility transistors (HEMTs), pseudomorphic HEMTs (pHEMTs), for example, may be incorporated without departing from the scope of the present teachings.

The first transistor 321 includes a gate connected to the negative input of the input port 301 to receive the negative differential offset input signal $V_{IN}'$, a source connected to ground voltage via current source 325, and a drain connected to supply voltage VDD via first resistor 331. The second transistor 322 includes a gate connected to the positive input of the input port 301 to receive the positive differential offset input signal $V_{IN}'$, a source connected to ground voltage via the current source 325, and a drain connected to the supply voltage VDD via second resistor 332. The electronic circuit 300 may also function in the capacity of a limiting buffer, where limiting is performed by driving the transistor pair 320 with a large enough input (differential offset input signal $V_{IN}'$) that the current source 325 is steered completely to one side or the other of the transistor pair 320.

In the depicted embodiment, the negative differential calibration signal $V_{CAL}$ received at the calibration port 305 is injected into a back-gate of the first transistor 321, and the positive differential calibration signal $V_{CAL}$ received at the calibration port 305 is injected into a back-gate of the second transistor 322. This configuration effectively sums the differential calibration signal $V_{CAL}$ with the differential offset input signal $V_{IN}'$, to provide the differential output signal $V_{OUT}$. As a result of the summing, the differential output signal $V_{OUT}$ has a corrected data waveform having a rising edge and a corresponding falling edge defining a corrected pulse width that is the same as the input pulse width of differential input signal $V_{IN}$ (before the input pulse width is mismatched by the influence of the offset voltage source, not shown in FIG. 3).

Injecting the positive differential calibration signal $V_{CAL}$ into the back-gate of each of the first and second transistors 321 and 322 means that the differential calibration signal $V_{CAL}$ enters at the wellp and welln ports (not shown) of each of the first and second transistors 321 and 322. The electronic circuit 300 shows calibration implemented in a simple buffer, but calibration may be implemented in a multiplexer or other type of logic gate, without departing from the scope of the present teachings. Advantageously, using the back-gate does not add any active devices or capacitive loading to the signal path (or switching path, as discussed below with reference to FIG. 4). This keeps added power to a minimum. A back-gate connection may be made, for example, using a bulk complementary metal-oxide-semiconductor (CMOS) process, or a fully depleted silicon-on-insulator (FDSOI) CMOS process, which allows greater freedom with the back-gate connection than the bulk CMOS process. However, other transistor technologies may be incorporated without departing from the scope of the present teachings.

In an alternative configuration, voltage offsets may be injected by summing in a calibration current from a DC current DAC at the output of a logic gate (e.g., logic gates 411-414 discussed below with reference to FIG. 4). The capacitance of the current DAC slows down the output node, so performance using the current DAC may not be as good as using the back-gate, although it is generally simpler to implement in a given process.

Figure 4:
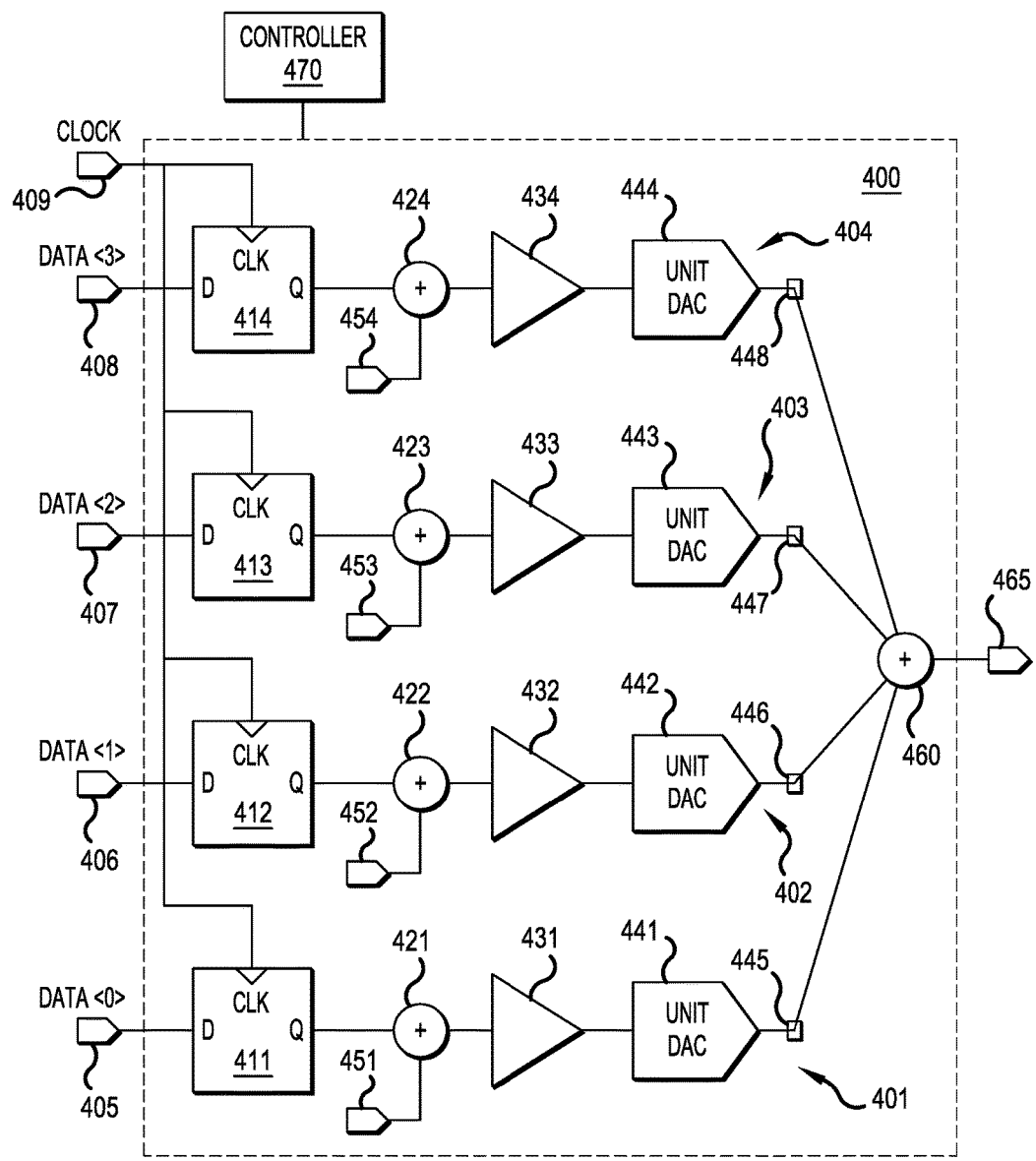
FIG. 4 is a simplified block diagram showing a switching digital-to-analog converter (DAC) including offset calibration for offset voltage compensation, according to a representative embodiment.

FIG. 4 is a simplified block diagram showing a switching digital-to-analog converter (DAC) including offset calibration for offset voltage compensation, according to a representative embodiment.

Referring to FIG. 4, switching DAC 400 includes multiple a parallel switching paths, indicated by representative first switching path 401, second switching path 402, third switching path 403 and fourth switching path 404. The first through fourth switching paths 401, 402, 403 and 404 have corresponding first through fourth input ports 405, 406, 407 and 408, respectively, for receiving digital data (data<0>, data<1>, data<2> and data<3>, respectively) of a differential digital input signal, and corresponding first through fourth output ports 445, 446, 447 and 448, respectively, for outputting differential analog output signals. The switching DAC 400 also includes an output summer 460 that sums the differential analog output signals respectively output from the first through fourth switching paths 401-404, and outputs a differential combined analog output signal corresponding to the differential digital input signal.

The first through fourth switching paths 401-404 include the same types of components. So, for the sake of convenience, only components of the first switching path 401 will be described in detail, and it will be understood that the corresponding components of the second through fourth switching paths 402-404 are substantially the same.

The first switching path 401 includes a first logic gate 411 that receives a first portion (e.g., data <0>) of the differential digital input signal, and a clock signal CS from clock 409. In various embodiments, the digital input signal may be N bits wide, where N is equal to four in the depicted example. The received first portion of the digital input signal has one or more first input pulses, each of which includes a rising edge and a corresponding falling edge that defines a first input pulse width. In the depicted embodiment, the logic gate 411 is a flip-flop, although other types of logic gates, such as a latch or an inverter, may be incorporated without departing from the scope of the present teachings. Mismatch in any components of the first switching path 401 (e.g., logic gate 411, first limiting buffer 431, and/or first unit DAC 441) effectively acts as an offset voltage source, such as the offset voltage source 210 discussed above with reference to FIG. 2.

In response to the first portion of the digital input signal, the logic gate 411 outputs a first offset input signal having one or more first mismatched input pulses, each of which includes a rising edge and a corresponding falling edge that defines a first mismatched pulse width. The first mismatched pulse width is different from the corresponding first input pulse width, due to relative movement of the rising edge and the corresponding falling edge of each of the first input pulses of the input digital signal in response to a voltage offset introduced by the logic gate, as discussed above with reference to the offset voltage source 210 in FIG. 2.

The first switching path 401 further includes a first summer 421, a first limiting buffer 431 and a first unit DAC 441 connected in series with the first logic gate 411, as well as a first direct current (DC) voltage source 451 (calibration voltage source) connected to the first summer 421. The first DC voltage source 451 generates a DC calibration signal to compensate for the voltage offset introduced by components of the first switching path 401 (e.g., logic gate 411, first limiting buffer 431, and/or first unit DAC 441), thereby correcting or readjusting the first mismatched pulse. That is, the first summer 421 sums the DC calibration signal output by the first DC voltage source 451 and the first offset input signal output by the first logic gate 411 to compensate for the voltage offset. This compensation provides a first corrected input signal (or, first corrected data waveform) having one or more first corrected input pulses, each of which includes a rising edge and a corresponding falling edge that defines a first corrected pulse width. The first corrected pulse width is the same as the corresponding first pulse width, meaning the pulse widths would result in the same analog conversion value, thus compensating for the voltage offset introduced by any or all components in first switching path 401.

The first limiting buffer 431 receives the first corrected input signal from the first summer 421, and buffers the first corrected input signal as needed for synchronized operation of the switching DAC 400. The first corrected input signal is ultimately provided to the first unit DAC 441, which performs a digital-to-analog operation on the first corrected input signal and outputs a corresponding first analog output signal (which is output by the first switching path 401). The first analog output signal is received by the output summer 460, where it is summed with a second analog output signal from the second switching path 402, a third analog output signal from the third switching path 403 and a fourth analog output signal from the fourth switching path 404. The output summer 460 outputs a differential combined analog output signal corresponding to the differential digital input signal. The combined analog output signal is output of the switching DAC 400 from main output port 465.

Likewise, as mentioned above, the second switching path 402 includes a second logic gate 412 (that receives a second portion (e.g., data <1>) of the digital input signal and the clock signal CS), a second summer 422, a second limiting buffer 432 and a second unit DAC 442 connected in series, as well as a second DC voltage source 452 connected to the second summer 422 to compensate for the voltage offset introduced by the second logic gate 412. The third switching path 403 includes a third logic gate 413 (that receives a third portion (e.g., data <2>) of the digital input signal and the clock signal CS), a third summer 423, a third limiting buffer 433 and a third unit DAC 443 connected in series, as well as a third DC voltage source 453 connected to the third summer 423 to compensate for the voltage offset introduced by the third logic gate 413. The fourth switching path 404 includes a fourth logic gate 414 (that receives a fourth portion (e.g., data <3>) of the digital input signal and the clock signal CS), a fourth summer 424, a fourth limiting buffer 434 and a fourth unit DAC 444 connected in series, as well as a fourth DC voltage source 454 connected to the fourth summer 424 to compensate for the voltage offset introduced by the fourth logic gate 414.

In various embodiments, the switching DAC 400 also includes a controller 470 configured to calibrate the first through fourth DC voltage sources 451-454 of each of the first through fourth parallel switching paths 401-404. The controller 470 may perform the calibration by determining a voltage level of each of the DC calibration signals that would enable the corresponding corrected input signal, after the summing of the DC calibration signal and the offset input signal, to have a corrected input pulse with a corrected pulse width that is the same as the input pulse width of the portion of the digital input signal provided to the corresponding one of the first through fourth parallel switching paths 401-404. The controller 470 may also include the clock that generates the clock signal CS. Also, the controller 470 may include suitable circuitry for controlling and/or supporting various other operations of the switching DAC 400. For example, the controller 470 may be operable to provide storage, processing, etc., during operations of the switching DAC 400.

Figure 5:
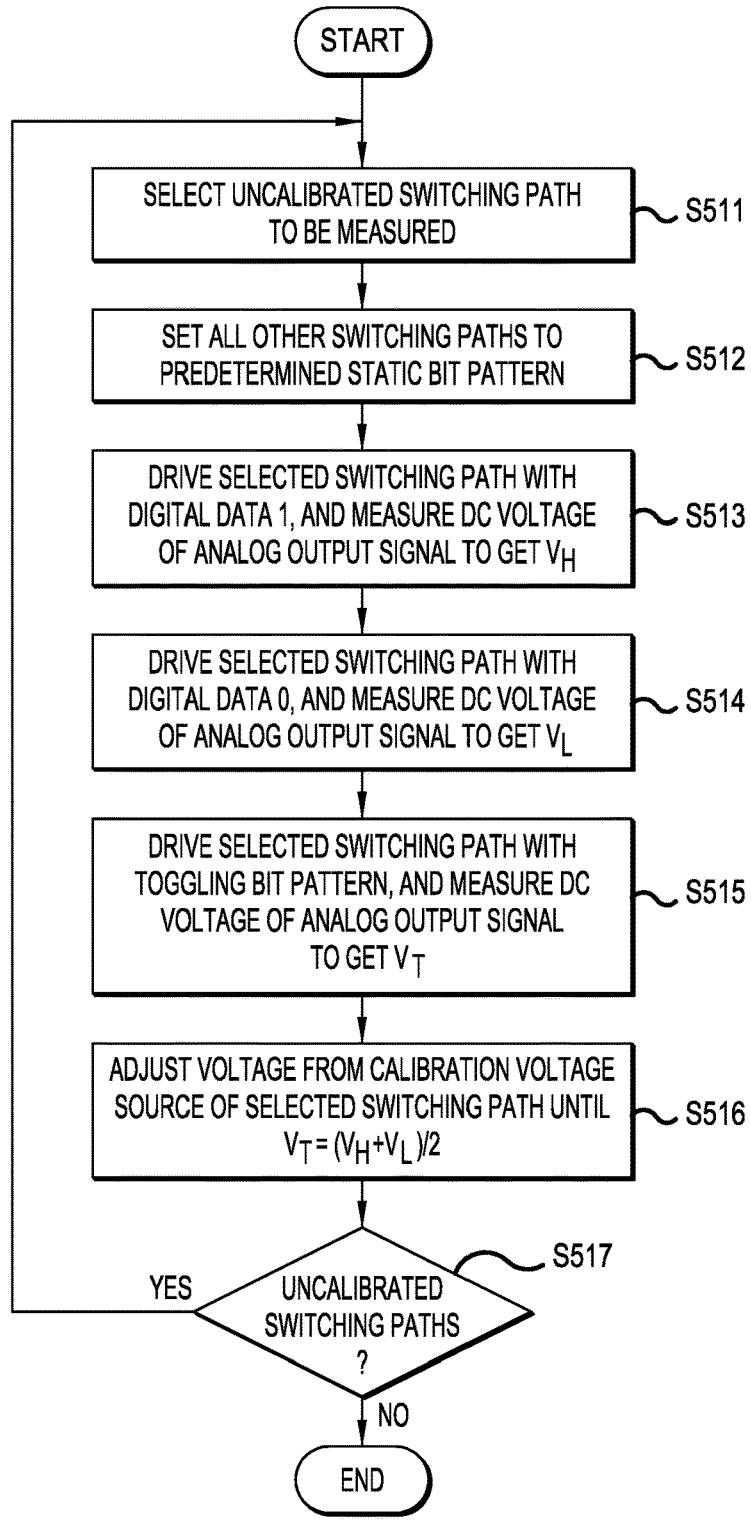
FIG. 5 is a simplified flow diagram showing an example of a calibration process implemented by a controller, according to a representative embodiment.

In an embodiment, the controller 470 calibrates the first through fourth DC voltage sources 451-454 of each of the first through fourth parallel switching paths 401-404 to determine optimum settings. The controller 470 calibrates the first through fourth DC voltage sources 451-454. The controller 470 calibrates the first through fourth DC voltage sources 451-454 by executing code and/or software, stored on a non-transitory computer readable medium (discussed below), causing the controller 470 to perform a calibration process. FIG. 5 is a simplified flow diagram showing an example of the calibration process implemented by the controller 470.

Referring to FIG. 5, the calibration process includes selecting a switching path to be measured from among the first through fourth parallel switching paths 401-404, at block S511, referred to as the selected switching path. At block S512, all other switching paths of the first through fourth parallel switching paths 401 to 404 are set to a predetermined static bit pattern that results in a voltage of the differential analog output signal measure at the main output port 465 being about zero. This reduces a size of the differential digital input signal that is digitized and reduces effects of nonlinearities.

At block S513, the selected switching path is driven with a one (1) as the respective digital data, and the DC voltage of the differential analog output signal is measured at the main output port 465 to obtain a high voltage response ($V_H$). At block S514, the selected switching path is driven with a zero (0) as the respective digital data, and the DC voltage of the differential analog output signal is measured at the main output port 465 to obtain a low voltage response ($V_L$). At block S515, the selected switching path is driven a toggling bit pattern (e.g., 010101 . . . ) as the respective digital data, and the DC voltage of the differential analog output signal is measured at the main output port 465 to obtain a toggling voltage response ($V_T$). At block S516, the voltage provided by the DC voltage source (calibration voltage source) of the selected switching path is adjusted until the toggling voltage response ($V_T$) of the DC calibration signal equals one half of the sum of the high voltage response ($V_H$) and the low voltage response ($V_L$), or $V_T=(V_H+V_L)/2$.

It is determined in block S517 whether there are any remaining switching paths that have not yet been calibrated. If there are (block S517: Yes), the process returns to block S511, and one of the remaining uncalibrated switching paths is selected. Blocks S512 through S516 are then repeated for the next selected switching path. When it is determined in block S517 that there are no remaining uncalibrated switching paths (block S517: No), the process ends.

In various embodiments, the controller 470 may be included in the switching DAC 400, or may be in a separate processor, computer, or other control unit. For example, the controller 470 may be implemented by a computer processor, application specific integrated circuits (ASICs), field-programmable gate arrays (FPGAs), or combinations thereof, using software, firmware, hard-wired logic circuits, or combinations thereof. A computer processor, in particular, may be constructed of any combination of hardware, firmware or software architectures, and may include its own memory (e.g., nonvolatile memory) for storing executable software/firmware executable code that allows it to perform the various functions. In an embodiment, the computer processor may comprise a central processing unit (CPU), for example, executing an operating system.

A memory (not shown) accessible by the controller 470 may be implemented by any number, type and combination of random access memory (RAM) and read-only memory (ROM), for example, and may store various types of information, such as computer programs and software algorithms executable by the controller 470 (and/or other components), as well as data and/or signals storage, for example. The various types of ROM and RAM may include any number, type and combination of computer readable storage media, such as a disk drive, an electrically programmable read-only memory (EPROM), an electrically erasable and programmable read only memory (EEPROM), a CD, a DVD, a universal serial bus (USB) drive, and the like, which are tangible and non-transitory storage media (e.g., as compared to transitory propagating signals).

Generally, the voltage offset calibration has important effects on performance of the switching DAC 400. For example, by tightening the spread of random timing errors in the first through fourth unit DACs 441-444, high order spurs are reduced. If dynamic element matching (DEM) techniques are employed, this manifests as an improvement in the noise floor. Also, second order distortion is reduced by improving the differential balance of the overall switching DAC 400.

The various components, structures, parameters and methods are included by way of illustration and example only and not in any limiting sense. In view of this disclosure, those skilled in the art can implement the present teachings in determining their own applications and needed components, materials, structures and equipment to implement these applications, while remaining within the scope of the appended claims.

What is claimed:

1. A switching digital-to-analog converter (DAC), comprising:
   a logic gate for receiving a digital input signal having a rising edge and a corresponding falling edge defining an input pulse width, and providing an offset input signal having a rising edge and a corresponding falling edge defining a mismatched pulse width different from the input pulse width due to relative movement of the rising edge and the corresponding falling edge of the digital input signal in response to a voltage offset introduced by the logic gate;
   a direct current (DC) voltage source for providing a DC calibration signal;
   a summer for summing the DC calibration signal and the offset input signal provided by the logic gate to compensate for at least the voltage offset introduced by the logic gate, and providing a corrected input signal having a rising edge and a corresponding falling edge defining a corrected pulse width that is the same as the input pulse width; and
   a unit DAC for receiving the corrected input signal as digital input, and selectively switching current of the unit DAC to an output of the switching DAC in response to voltage values of the corrected input signal to provide an analog output,
   wherein the switching DAC outputs an analog output signal, corresponding to the digital input signal, based at least in part on the analog output from the unit DAC.

2. The switching DAC of claim 1, further comprising:
   a limiting buffer for buffering the corrected input signal to drive the unit DAC.

3. The switching DAC of claim 1, wherein the digital input signal represents a voltage value.

4. The switching DAC of claim 1, wherein the logic gate comprises a flip-flop for receiving the digital input signal and a clock signal.

5. The switching DAC of claim 4, wherein the flip-flop implements differential logic.

6. The switching DAC of claim 5, wherein the digital input signal of the switching DAC is a differential input signal, and the analog output signal of the switching DAC is a differential output signal.

7. The switching DAC of claim 2, wherein the DC calibration signal further compensates for additional voltage offset introduced by the limiting buffer and the unit DAC.

8. A switching digital-to-analog converter (DAC), comprising:
   a plurality of parallel switching paths having a corresponding plurality of inputs for respectively receiving digital data of an differential digital input signal; and
   an output summer for summing analog outputs respectively provided by the plurality of parallel switching paths to provide a differential analog output signal corresponding to the differential digital input signal,
   wherein each switching path of the plurality of parallel switching paths comprises:
      a logic gate for receiving the respective digital data of the differential digital input signal, the respective digital data having an input pulse with a corresponding input pulse width, and for outputting a mismatched input signal having a mismatched pulse with a corresponding mismatched pulse width different from the input pulse width, resulting from a voltage offset introduced by the logic gate;
      a direct current (DC) voltage source for providing a DC calibration signal;
      a unit DAC driver comprising a summer and a limiting buffer, the summer for summing the DC calibration signal and the mismatched input signal as digital input to compensate for at least the voltage offset introduced by the logic gate, and the limiting buffer for buffering the summed DC calibration signal and the mismatched input signal to provide a corrected input signal having a corrected pulse with a corresponding corrected pulse width that is the same as the input pulse width; and
      a unit DAC driven by the corrected input signal from the unit DAC driver to provide respective analog data corresponding to the switching path, and to selectively switch the respective analog data to the output summer.

9. The switching DAC of claim 8, wherein the unit DAC driver of each of the plurality of parallel switching paths comprises a pair of transistors configured to receive the respective mismatched input signal, and
   wherein the DC calibration signal of each of the plurality of parallel switching paths is injected into the unit DAC driver via back-gates of each transistor in the pair of transistors in order to be summed with the mismatched input signal.

10. The switching DAC of claim 8, further comprising:
a controller programmed to calibrate the DC voltage source of each of the plurality of parallel switching paths by determining a voltage level of each of the DC calibration signals that enables the corrected pulse of the corrected input signal to have the corresponding corrected pulse width that is the same as the input pulse width.

11. The switching DAC of claim 10, wherein the controller is programmed to execute code, stored on a non-transitory computer readable medium, causing the controller to perform a calibration process comprising:
selecting one switching path of the plurality of parallel switching paths;
measuring DC voltage of the differential analog output signal at the output summer;
setting all other switching paths of the plurality of parallel switching paths to a predetermined static bit pattern that results in a voltage of the differential analog output signal being about zero, which reduces a size of the differential digital input signal that is digitized and reduces effects of nonlinearities;
driving the selected switching path to be measured with a one (1) as the respective digital data, and measuring the DC voltage of the differential analog output signal to obtain high voltage response ($V_H$);
driving the selected switching path to be measured with a zero (0) as the respective digital data, and measuring the DC voltage of the differential analog output signal to obtain low voltage response ($V_L$);
driving the selected switching path to be measured with a toggling bit pattern as the respective digital data, and measuring the DC voltage of the differential analog output signal to obtain toggling voltage response ($V_T$); and
adjusting a voltage of the DC voltage source until $V_T$ of the DC calibration signal equals one half of the sum of $V_H$ and $V_L$.

12. The switching DAC of claim 8, wherein when the mismatched pulse width is less than the input pulse width, the DC voltage source provides the DC calibration signal having a positive voltage.

13. The switching DAC of claim 8, wherein when the mismatched pulse width is longer than the input pulse width, the DC voltage source provides the DC calibration signal having a negative voltage.

14. The switching DAC of claim 8, wherein the DC calibration signal further compensates for additional voltage offset introduced by the limiting buffer of the corresponding path.

15. A switching digital-to-analog converter (DAC), comprising:
a plurality of parallel switching paths having a corresponding plurality of input ports for respectively receiving digital data of a differential digital input signal; and
an output summer for summing analog outputs respectively output by the plurality of parallel switching paths to provide a differential analog output signal corresponding to the differential digital input signal,
wherein each switching path of the plurality of parallel switching paths comprises:
a logic gate for receiving the respective digital data of the differential digital input signal, the respective digital data having an input pulse defined by a rising edge and a corresponding falling edge following a first delay from the rising edge, and for outputting a mismatched input signal having a mismatched pulse defined by a rising edge and a corresponding falling edge following a second delay, wherein the second delay is different than the first delay as a result of a voltage offset introduced by the logic gate;
a direct current (DC) voltage source for providing a DC calibration signal;
a summer configured to sum the DC calibration signal and the mismatched input signal to compensate for at least the voltage offset introduced by the logic gate, and to provide a corrected input signal having a corrected pulse defined by a rising edge and a corresponding falling edge following a third delay, wherein the third delay is equal to the first delay;
a limiting buffer configured to buffer the corrected input signal; and
a unit DAC driven by the buffered corrected input signal output by the limiting buffer as digital input to provide a corresponding analog output, and to selectively switch the analog output from the switching path to the output summer.

16. The switching DAC of claim 15, wherein at least one of the summer and the limiting buffer of each of the plurality of parallel switching paths comprises a pair of transistors configured to receive the respective mismatched input signal, and
wherein the DC calibration signal of each of the plurality of parallel switching paths is injected into back-gates of each transistor in the pair of transistors in order to be summed with the mismatched input signal.

17. The switching DAC of claim 15, further comprising:
a controller programmed to calibrate the DC voltage source of each of the plurality of parallel switching paths by determining a voltage level of each of the DC calibration signals that enables the third delay to be equal to the first delay.

18. The switching DAC of claim 17, wherein the controller is programmed to execute code, stored on a non-transitory computer readable medium, causing the controller to perform a calibration process comprising:
selecting one switching path of the plurality of parallel switching paths;
measuring DC voltage of the differential analog output signal at the output summer;
setting all other switching paths of the plurality of parallel switching paths to a predetermined static bit pattern that results in a voltage of the differential analog output signal being about zero, which reduces a size of the differential digital input signal that is digitized and reduces effects of nonlinearities;
driving the selected switching path to be measured with a one (1) as the respective digital data, and measuring the DC voltage of the differential analog output signal to obtain high voltage response ($V_H$);
driving the selected switching path to be measured with a zero (0) as the respective digital data, and measuring the DC voltage of the differential analog output signal to obtain low voltage response ($V_L$);
driving the selected switching path to be measured with a toggling bit pattern as the respective digital data, and measuring the DC voltage of the differential analog output signal to obtain toggling voltage response ($V_T$); and
adjusting a voltage of the DC voltage source until $V_T$ of the DC calibration signal equals one half of the sum of $V_H$ and $V_L$.

19. The switching DAC of claim 15, wherein when the second delay of the mismatched pulse is less than the first delay of the input pulse, the DC voltage source provides the DC calibration signal having a positive voltage, and wherein when the second delay of the mismatched pulse is longer than the first delay of the input pulse, the DC voltage source provides the DC calibration signal having a negative voltage.

20. The switching DAC of claim 15, wherein the DC calibration signal further compensates for additional voltage offset introduced by the limiting buffer and the unit DAC of the corresponding path.

* * * * *